(12) United States Patent
Li et al.

(10) Patent No.: US 9,673,173 B1
(45) Date of Patent: Jun. 6, 2017

(54) INTEGRATED CIRCUIT PACKAGE WITH EMBEDDED PASSIVE STRUCTURES

(71) Applicant: Altera Corporation, San Jose, CA (US)

(72) Inventors: Zhe Li, San Jose, CA (US); Yuanlin Xie, Fremont, CA (US)

(73) Assignee: Altera Corporation, San Jose, CA (US)

( * ) Notice: Subject to any disclaimer, the term of this patent is extended or adjusted under 35 U.S.C. 154(b) by 19 days.

(21) Appl. No.: 14/808,743

(22) Filed: Jul. 24, 2015

(51) Int. Cl.
| | |
|---|---|
| H01L 23/498 | (2006.01) |
| H01L 25/065 | (2006.01) |
| H01L 25/00 | (2006.01) |
| H01L 21/56 | (2006.01) |
| H01L 21/768 | (2006.01) |
| H01L 23/522 | (2006.01) |

(Continued)

(52) U.S. Cl.
CPC ........ H01L 25/0655 (2013.01); H01L 21/565 (2013.01); H01L 21/76802 (2013.01); H01L 21/76877 (2013.01); H01L 23/3107 (2013.01); H01L 23/49816 (2013.01); H01L 23/528 (2013.01); H01L 23/5223 (2013.01); H01L 23/5226 (2013.01); H01L 23/5227 (2013.01); H01L 24/89 (2013.01); H01L 25/50 (2013.01); H01L 2224/08225 (2013.01); H01L 2224/80001 (2013.01); H01L 2924/1205 (2013.01); H01L 2924/1206 (2013.01); H01L 2924/14 (2013.01); H01L 2924/19041 (2013.01); H01L 2924/19042 (2013.01)

(58) Field of Classification Search
CPC ............. H01L 23/498; H01L 34/49894; H01L 23/5389; H01L 25/162; H01L 25/0655; H01L 25/50; H01L 21/565; H01L 21/76802; H01L 21/76877; H01L 23/5223; H01L 23/5227; H01L 23/5226; H01L 23/528; H01L 23/49816; H01L 23/3107; H01L 24/89; H01L 2224/80001; H01L 2924/14; H01L 2924/08225; H01L 2924/1205; H01L 2924/1206; H01L 2924/19041; H01L 2924/19042
USPC ....... 257/723, 686, 685, 728, 778, 734, 737, 257/738, 528, 531, 532, 535
See application file for complete search history.

(56) References Cited

U.S. PATENT DOCUMENTS

| | | |
|---|---|---|
| 6,586,676 B2 | 7/2003 | Pritchett et al. |
| 6,946,601 B1 | 9/2005 | Lee et al. |

(Continued)

Primary Examiner — Alexander Oscar Williams

(57) ABSTRACT

An integrated circuit package with embedded passive structures may include first and second integrated circuit dies that are surrounded by capacitor structures. A molding compound is deposited to encapsulate the integrated circuit dies and the capacitor structures. The molding compound is then attached to a redistribution wafer, in which the integrated circuit dies and the capacitor structures are electrically connected to metal routing layers of the redistribution wafer. A conductive layer is subsequently formed over the first integrated circuit die in the molding compound. The conductive layer is made up of additional metal routing layers and inductor structures. The integrated circuit package may further include a group of conductive vias that is formed in the molding compound. Each conductive via has a first end contacting the metal routing layers of the distribution wafer, and a second end contacting the conductive layer.

20 Claims, 8 Drawing Sheets

(51) Int. Cl.
*H01L 23/528* (2006.01)
*H01L 23/31* (2006.01)
*H01L 23/00* (2006.01)

(56) References Cited

U.S. PATENT DOCUMENTS

| | | | |
|---|---|---|---|
| 7,932,590 B2 | 4/2011 | Lam | |
| 8,106,479 B1* | 1/2012 | Nathawad | H01L 23/5225 257/533 |
| 8,324,023 B2 | 12/2012 | Lam | |
| 2002/0186552 A1* | 12/2002 | Kimura | H01L 23/5383 361/763 |
| 2004/0160752 A1* | 8/2004 | Yamashita | H01L 23/49894 361/766 |
| 2004/0188827 A1* | 9/2004 | Akashi | H01L 23/3128 257/700 |
| 2009/0145636 A1* | 6/2009 | Miki | H01L 21/6835 174/255 |
| 2009/0170242 A1 | 7/2009 | Lin et al. | |
| 2009/0322364 A1* | 12/2009 | Mangrum | G01R 31/2889 324/757.02 |
| 2010/0027225 A1* | 2/2010 | Yuda | H05K 1/141 361/736 |
| 2010/0140779 A1* | 6/2010 | Lin | H01L 23/49816 257/690 |
| 2011/0076800 A1* | 3/2011 | Hirai | H01L 21/561 438/107 |
| 2012/0175731 A1* | 7/2012 | Chen | H01L 27/016 257/531 |
| 2013/0334680 A1* | 12/2013 | Boone | H01L 23/49575 257/737 |
| 2014/0110840 A1* | 4/2014 | Wojnowski | H01L 23/49822 257/738 |
| 2014/0185264 A1* | 7/2014 | Chen | H01L 23/3128 361/814 |
| 2014/0264733 A1 | 9/2014 | Yuan et al. | |
| 2015/0235952 A1* | 8/2015 | Pan | H01L 23/5384 361/782 |

* cited by examiner

US 9,673,173 B1

INTEGRATED CIRCUIT PACKAGE WITH EMBEDDED PASSIVE STRUCTURES

BACKGROUND

As the semiconductor industry continues to grow, the need to develop increasingly complex integrated circuits with smaller feature sizes and dimensions has been highly sought after. Driven by the demand for high performance, chip scale packaging technologies have been applied to the packaging of individual integrated circuit dies at wafer-level in order to meet requirements for high integration, weight lightening, thickness reduction, shortening the length and miniaturization of the integrated circuit package.

As one example of the chip scale packaging technologies, there is a wafer level fan-out package (WLFOP) in which an individual integrated circuit die is embedded in a molding compound with space allocated between each integrated circuit die for additional input/output (I/O) connection points. The integrated circuit dies and the molding compound are then mounted on a wafer substrate containing conductive lines (also referred to herein as a "redistribution wafer"). In the WLFOP technology, passive components such as inductors are typically formed on, embedded, or otherwise integrated into the wafer substrate.

However, a reduction of the overall package size (e.g., form factor) of a WLFOP becomes difficult due to the arrangements of the passive components in the proximity of the conductive lines in the wafer area. Such a configuration may result in an increased likelihood of cross-talk and signal interference, which may degrade package reliability and performance, as well as making such packages more difficult to assemble in a high volume product.

SUMMARY

In accordance with the present invention, apparatuses and methods are provided for creating an integrated circuit package with embedded passive structures.

It is appreciated that the present invention can be implemented in numerous ways, such as a process, an apparatus, a system, or a device. Several inventive embodiments of the present invention are described below.

A method for packaging integrated circuit dies is provided. The method includes encapsulating two adjacent integrated circuit dies with a molding compound and forming a passive component over the molding compound. The two integrated circuit dies are then mounted on a redistribution wafer, with the first integrated circuit die interposed between the passive component and the redistribution wafer. Prior to encapsulating the integrated circuit dies, a group of capacitor structures is formed surrounding the two integrated circuit dies. Metal routing layers may be formed on the two integrated circuit dies. The method further includes attaching the encapsulated first and second circuit dies to metal routing layers of the redistribution wafer, where the metal routing layers are electrically connected to the two integrated circuit dies and the capacitor structures. Accordingly, a group of vias is formed in the molding compound to connect the passive component to the metal routing layers.

An integrated circuit package produced by a process is disclosed. The process of producing the integrated circuit package may include the steps of forming a non-conductive layer that encapsulates first and second integrated circuit dies. The process of producing the integrated circuit package may also include the step of forming a group of conductive vias through the non-conductive layer. A conductive layer may be formed over the non-conductive layer, where the conductive layer comprises a group of passive structures, each of which is connected to an end of each of the conductive vias. The non-conductive layer is then attached to routing layers of a redistribution wafer. The routing layers include metal layers, each of which is connected to another end of the conductive vias.

An integrated circuit package is provided. The integrated circuit package includes first and second integrated circuit dies that are encapsulated by a molding compound. A redistribution wafer having routing layers is attached to a bottom surface of the molding compound, where the first and second integrated circuit dies are electrically connected to the metal routing layers of the redistribution wafer. The integrated circuit package further includes a conductive structure formed over the first integrated circuit die in the molding compound. Prior to the formation of the conductive structures, multiple vias are formed in the molding compound. Each of the vias has a first end contacting the routing layers of the redistribution wafer and a second end contacting the conductive structure.

Further features of the invention, its nature and various advantages, will be more apparent from the accompanying drawings and the following detailed description of the preferred embodiments.

DETAILED DESCRIPTION

The embodiments provided herein include integrated circuit structures and packaging techniques for creating an integrated circuit package with embedded passive structures.

It will be obvious, however, to one skilled in the art that the present exemplary embodiments may be practiced without some or all of these specific details described with reference to the respective embodiments. In other instances, well-known operations have not been described in detail in order not to obscure unnecessarily the present embodiments.

Figure 1:
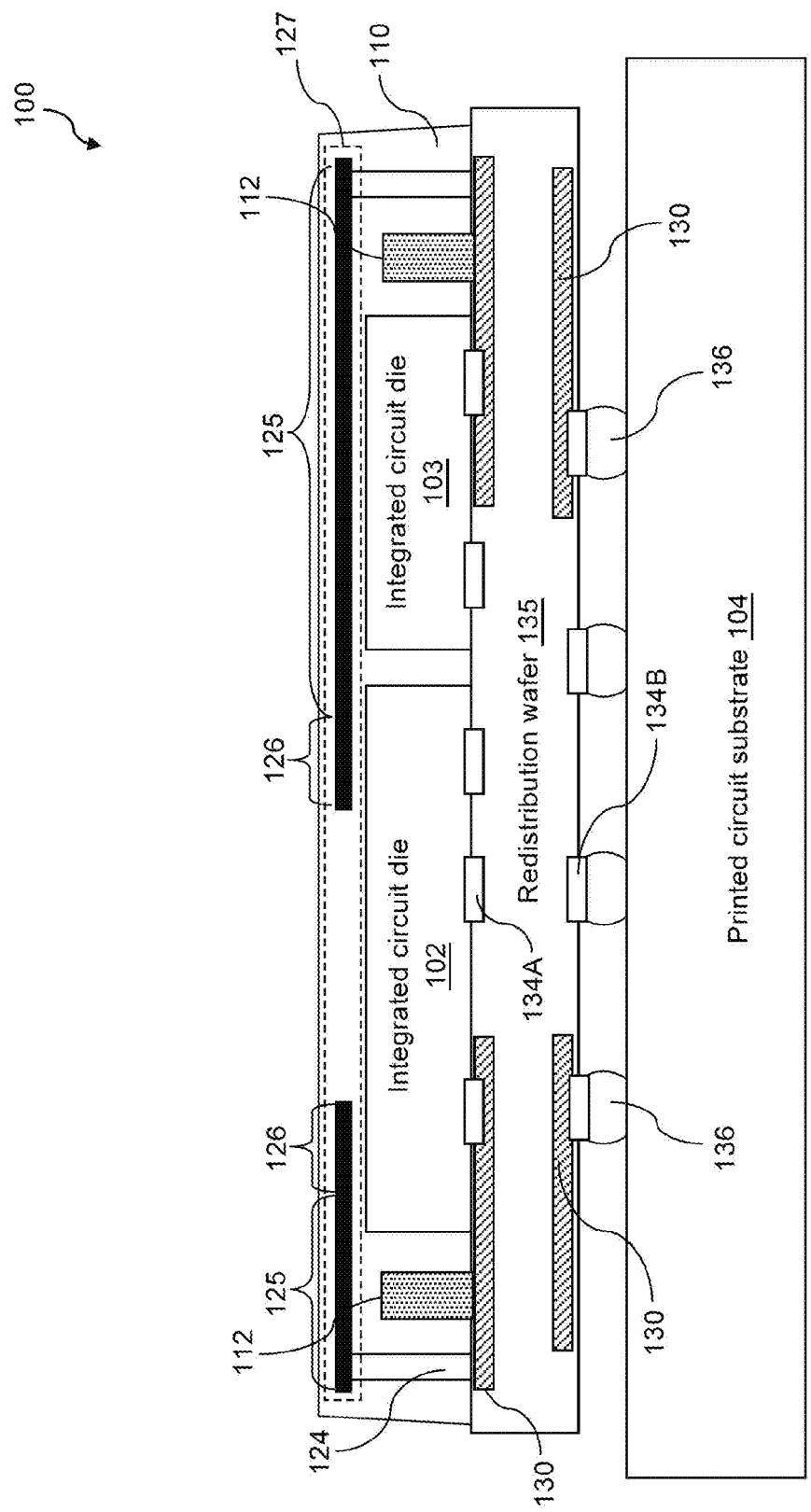
FIG. 1 shows a cross-sectional side view of an illustrative integrated circuit package in accordance with an embodiment of the present invention.

FIG. 1 shows a cross-sectional side view of an illustrative integrated circuit package 100 in accordance with an embodiment of the present invention. Integrated circuit package 100 includes integrated circuit die 102 and integrated circuit die 103, both of which are positioned adjacent to each other. As used herein, the term "adjacent" means "next to," laterally adjacent, or immediately adjacent. Two immediately adjacent items (e.g., integrated circuit dies 102 and 103) may or may not be in contact with each other, but there is no other item of the same kind (e.g., another integrated circuit die) that is interposed between the adjacent items. In one embodiment, integrated circuit dies 102 and 103 may be flip-chip dies. Accordingly, a group of passive structures such as capacitor components (e.g., capacitor structures 112) or inductor components can be formed surrounding integrated circuit dies 102 and 103. Generally, capacitor structures such as capacitor structures 112 may be employed in integrated circuit package 100 to perform a variety of functions. For example, capacitor structures 112 can be used to construct band pass filters, phase locked loops (PLLs), and etc.

As shown in FIG. 1, molding compound 110 may encapsulate integrated circuit dies 102 and 103, and capacitor structures 112 to form integrated circuit package 100. Accordingly, a group of conductive vias (e.g., conductive vias 124) may be formed in molding compound 110 to electrically connect integrated circuit dies 102 and 103 to electrical components that are formed over molding compound 110. In the embodiment of FIG. 1, conductive vias 124 may extend between the top surface and the bottom surface of molding compound 110 to form signal transmission structures. For example, conductive via 124 may be plated through-hole vias. Generally, conductive vias 124 may be formed by drilling or lasering holes through molding compound 110. Each hole may be subsequently plated or filled with an electrically conductive material (e.g., copper).

In one embodiment, a conductive layer (e.g., conductive layer 127) is formed over molding compound 110 and above integrated circuit dies 102 and 103. For example, as shown in FIG. 1, conductive layer 127 may include metal traces 125 and another group of passive components (e.g., inductor structures 126), which will be described in detail in FIG. 2. Conductive layer 127 may be coupled to conductive vias 124 from molding compound 110 to electrically connect to integrated circuit dies 102 and 103.

Subsequently, integrated circuit package 100 may be mounted on a wafer substrate (e.g., redistribution wafer 135 of FIG. 1). As shown in FIG. 1, redistribution wafer 135 may contain metal traces 130 and conductive pads (e.g., conductive pads 134A and 134B). Integrated circuit dies 102 and 103 are mechanically and electrically connected to metal traces 130 via conductive pads 134A. Accordingly, capacitor structures 112 may be connected to the surface of redistribution wafer 135 via metal traces 130. Solder balls 136, disposed on conductive pads 134B on the bottom surface of redistribution wafer 135, may provide electrical communication from integrated circuit package 100 to a printed circuit substrate (e.g., printed circuit substrate 104), which may also host other circuits. For example, solder balls 136 may be part of a ball grid array.

Figure 2:
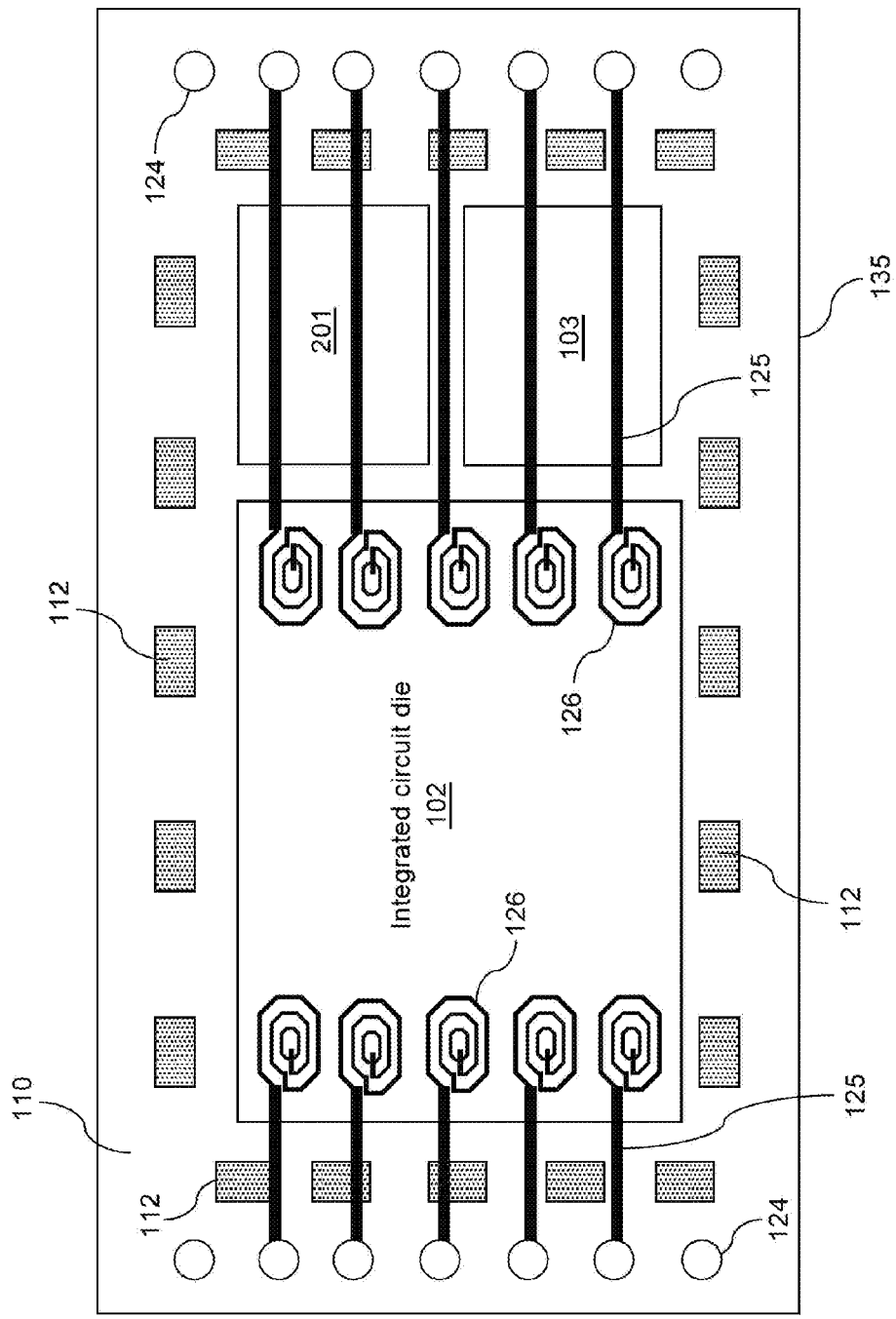
FIG. 2 shows a top view of an integrated circuit package having passive components in accordance with one embodiment of the present invention.

FIG. 2 shows a top view of integrated circuit package 100 of FIG. 1 having passive components in accordance with one embodiment of the present invention. As mentioned above, integrated circuit package 100 may include integrated circuit die 102 and integrated circuit die 103. In one embodiment, integrated circuit die 102 is bigger (e.g., ten times or more) than integrated circuit die 103. For example, integrated circuit die 102 may be a programmable logic device and integrated circuit die 103 may be a memory die. If desired, additional integrated circuit dies (e.g., integrated circuit die 201) may be added and positioned adjacent to either or both of integrated circuit dies 102 and 103.

Integrated circuit dies 102, 103, and 201 may be packaged with a group of passive components (e.g., capacitor structures 112) in a side-by-side structure. For example, as shown in FIG. 2, capacitor structures 112 may be formed surrounding integrated circuit dies 102, 103, and 201. Molding compound 110 may encapsulate the integrated circuit dies and the passive components to form integrated circuit package 100.

In one embodiment, a conductive layer (e.g., conductive layer 127 of FIG. 1) that includes metal traces 125 and another group of passive components (e.g., inductor structures 126) are formed over integrated circuit die 102 near the top surface of molding compound 110. For example, inductor structures 126 (also referred to as inductive elements or conductive loops) may be formed and configured in spiral arrangements above integrated circuit die 102 to improve planarity of molding compound 110. Each of inductor structures 126 may be formed by metal deposition within the top surface of molding compound 110. The metal forming inductor structures 126 may be any suitable metal (e.g., gold) that is deposited within molding compound 110. It should be appreciated that the shape and size of the inductor structures 126 may be modified as desired or needed.

Accordingly, each of inductor structures 126 may be connected to a corresponding trace of metal traces 125. As shown in FIG. 2, metal traces 125 may electrically connected to conductive vias 124 such that inductor structures 126 are connected to integrated circuit dies 102, 103, and 201. Such a configuration may improve input/output (I/O) interconnectivity by creating shorter interconnection to reach embedded passive components (e.g., capacitor structures 112 and inductor structures), which in turn may reduce connection resistance, parasitic capacitance, and parasitic inductance, and increases current throughput.

Figure 3:
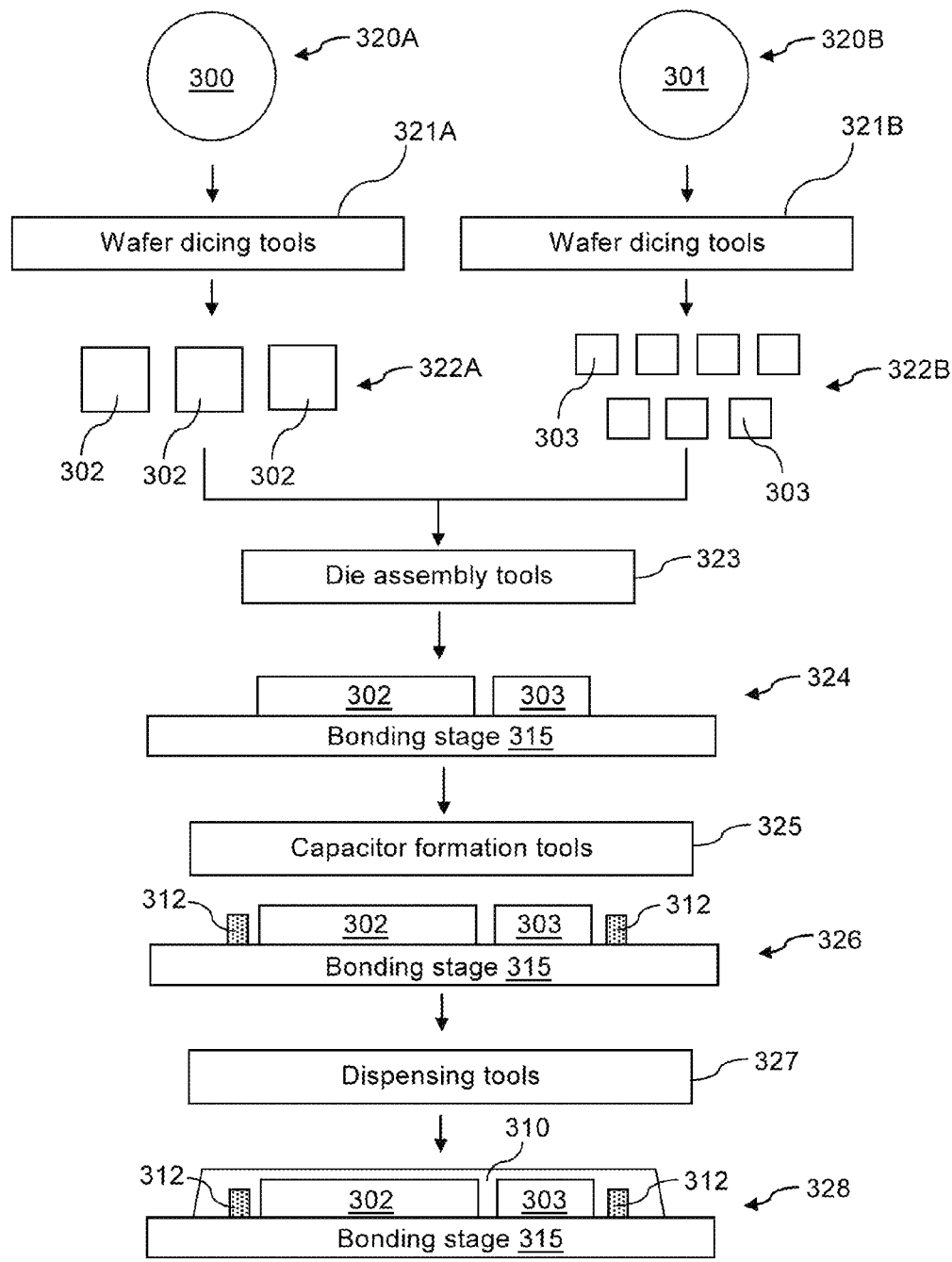
FIG. 3 shows illustrative steps for packaging integrated circuit dies in accordance with one embodiment of the present invention.

FIG. 3 shows illustrative steps for packaging integrated circuit dies in accordance with one embodiment of the present invention. As shown in step 320A, semiconductor wafer 300 is singulated (e.g., diced) into individual integrated circuit dies 302 (as shown in step 322A) using wafer dicing tools 321A. Similarly, at step 320B, semiconductor wafer 301 is singulated into individual integrated circuit dies 303 (as shown in step 322B) using wafer dicing tools 321B. In practice, one or more steps involving the same integrated components may be combined with other steps, performed in any suitable order, performed in parallel (e.g., simultaneously or substantially simultaneously), or removed. For example, the wafer dicing operations involving semiconductor wafers 300 and 301 may be performed in parallel to save time and cost.

At step 324, an individual integrated circuit die 302 and an individual integrated circuit die 303 are assembled on a bonding stage (e.g., bonding stage 315) using die assembly tools 323. In this step, integrated circuit dies 302 and 303 may be assembled in a flip-chip configuration, where the front surfaces (e.g., active surface) of integrated circuit dies 302 and 303 are mounted on bonding stage 315. As an example, an adhesive tape (not shown) may be placed on the bonding stage 315. Integrated circuit dies 302 and 303 are then attached onto the not-shown adhesive tape in a suitable position (e.g., adjacent to each other).

At step 326, a group of capacitor structures (e.g., capacitor structures 312) is formed surrounding integrated circuit dies 302 and 303. Tools such as capacitor formation tools 325 may be used to form capacitor structures 312 on bonding stage 315. In the depicted example, capacitor structures 312 may be positioned on the not-shown adhesive tape on bonding stage 315 prior to the application of a non-conductive material, which will be described below.

At step 328, once capacitor structures 312 are positioned to bonding stage 315, the non-conductive material (e.g., molding compound 310) may be deposited by dispensing tools 327 to encapsulate integrated circuit die 302, integrated circuit die 303, and capacitor structures 312 at step 328. For example, molding compound 310 is formed to encapsulate integrated circuit die 302, integrated circuit die 303, and capacitor structures 312. Such an arrangement may protect capacitor structures 312, integrated circuit dies 302 and 303 and their electrical connections (not shown) from breakage and hazardous environmental contaminants. For example, molding compound 310 may be any suitable material, and in one embodiment may be composed of a mixture of epoxy resin and ceramic filler material.

Figure 4:
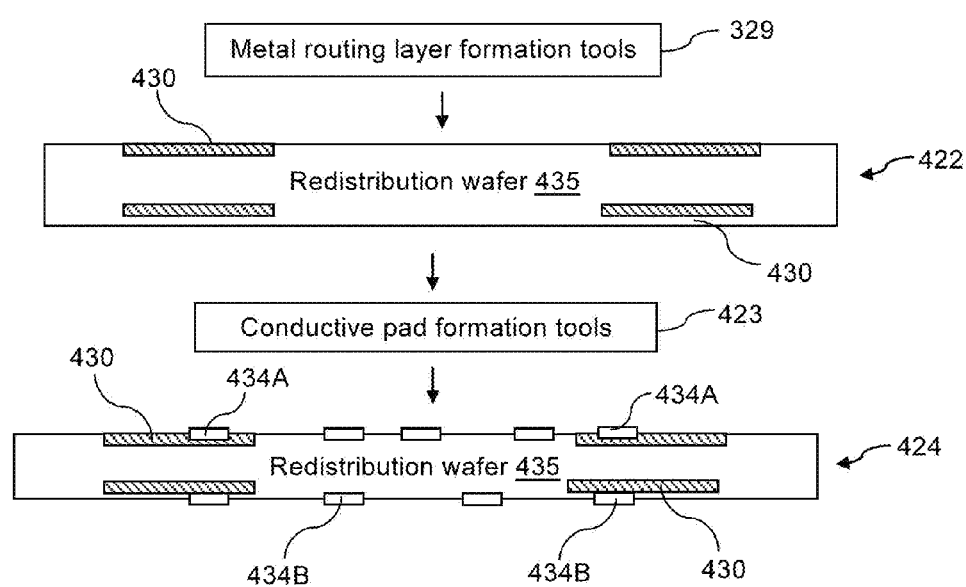
FIG. 4 shows illustrative steps for fabricating a redistribution wafer in accordance with one embodiment of the present invention.

FIG. 4 shows illustrative steps for fabricating a redistribution wafer in accordance with one embodiment of the present invention. At step 422, metal routing layers 430 are formed in redistribution wafer 435. For example, metal routing layers 430 may be formed through an electroplating process and/or a deposition process using metal routing layer formation tools 421. Metal routing layers 430 may form an interconnect structure in redistribution wafer 435 that may electrically connect components that are placed on both sides of redistribution wafer 435.

At step 424, conductive pads (e.g., conductive pads 434A and 434B) are formed on redistribution wafer 435 using conductive pad formation tools 423. In this step, a set of conductive pads (e.g., conductive pads 434A) are formed on a top surface of redistribution wafer 435. Accordingly, another set of conductive pads (e.g., conductive pads 134B) are formed on a bottom surface of redistribution wafer 435. It should be noted that redistribution wafer 435 may still be in a whole wafer form (undiced) prior to the formations of the metal routing layers and conductive pads. Alternatively, redistribution wafer 435 may be diced (e.g., using wafer dicing tools) before the formations of the metal routing layers and conductive pads.

Figure 5:
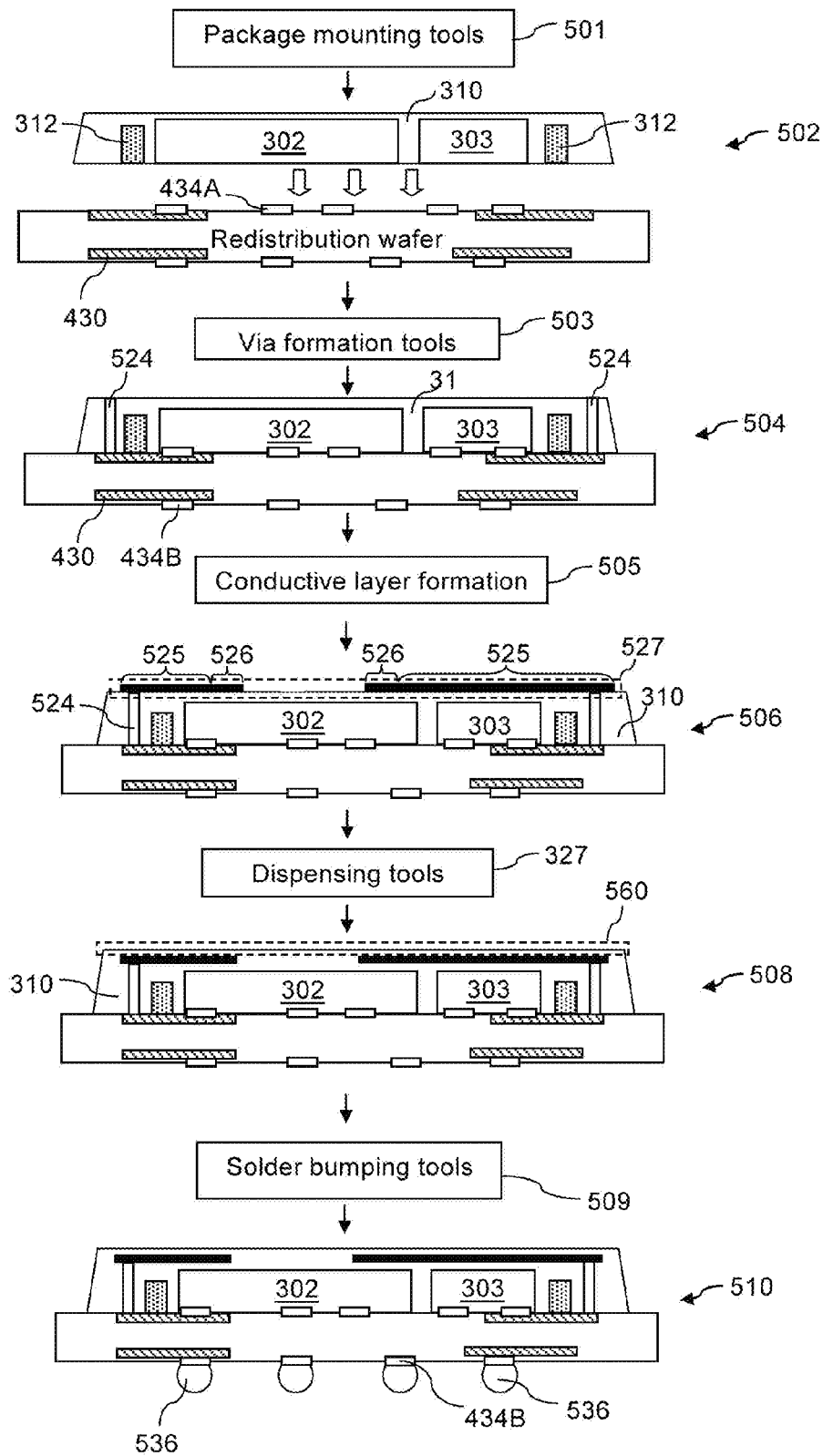
FIG. 5 shows illustrative steps for assembling an integrated circuit package in accordance with one embodiment of the present invention.

FIG. 5 shows illustrative steps for assembling an integrated circuit package in accordance with one embodiment of the present invention. It should be appreciated that the embodiments of FIGS. 3 and 4 may be used as examples to illustrate the steps described below.

At step 502, integrated circuit dies 302 and 303, and capacitor structures 312, all of which are encapsulated by molding compound 310, are attached to redistribution wafer 435 using package mounting tools 501. With reference to step 502 of FIG. 5, integrated circuit dies 302 and 303, may electrically connect to redistribution wafer 435 via conductive pads 434A.

At step 504, a group of conductive vias (e.g., conductive vias 524) is formed in molding compound 310 to form signal transmission structures. As an example, conductive vias 524 may be formed using via formation tools 503. For example, via formation tools 503 may perform drilling or lasering to form holes through molding compound 310. The holes are then plated or filled with an electrically conductive metal (e.g., copper) to form conductive vias 524.

At step 506, a conductive layer (e.g., conductive layer 527) is formed over molding compound 310. In an exemplary embodiment, conductive layer 527 may be similar to conductive layer 127 of FIG. 1. For example, conductive layer 527 may include metal traces 525 that are connected to inductor structures 526. In one embodiment, the inductor structure 526 may be formed and configured in similar arrangements as inductor structures 126 of FIG. 2 above integrated circuit die 302 to improve planarity of molding compound 310. Conductive layer 527 may be formed using conductive layer formation tools 505. For example, conductive layer formation tools 505 may include tools such as metal routing layer formation tools (e.g., metal routing layer formation tools 421 of FIG. 4) and inductor formation tools (not shown) to form the metal traces 525 and inductor structures 526 within molding compound 310.

At step 508, additional molding compound 310 (as highlighted in region 560) is dispensed to cover conductive layer 527 using dispensing tools 327 of FIG. 3. In this step, the exposed surfaces of the components (e.g., metal traces 525 and inductor structures 526) of conductive layer 527 are covered with an additional molding compound to insulate metal traces 525 from oxidation. If desired, an additional integrated circuit die (not shown) can be attached or stacked on molding compound 310 so as to form a three-dimensional (3D) package, which may result in increased density and smaller form factor. For example, the additional integrated circuit die may electrically couple to integrated circuit dies 302 and 303 through conductive vias 524 in molding compound 310.

At step 510, external connectors such as solder balls 536, for example, are formed on a bottom surface of redistribution wafer 435 (via conductive pads 434B) using solder bumping tools 509. Such a configuration may provide external electrical connections for integrated circuit dies 302 and 303 by way of solder balls 536 to a printed circuit substrate (e.g., printed circuit substrate 104 of FIG. 1), which may be populated with other circuits.

Subsequently, redistribution wafer 425 may be diced or singulated using wafer dicing tools. It should be appreciated that redistribution wafer 435 may contain individual undiced integrated circuit packages, even though only one integrated circuit package is used as an example to illustrate the steps above. As mentioned above in FIG. 4, redistribution wafer 425 may still be in a whole wafer form. Therefore, a wafer dicing operation may be performed to singulate redistribution wafer 425 into individual integrated circuit packages (e.g., integrated circuit package 100 of FIG. 1).

Figure 6:
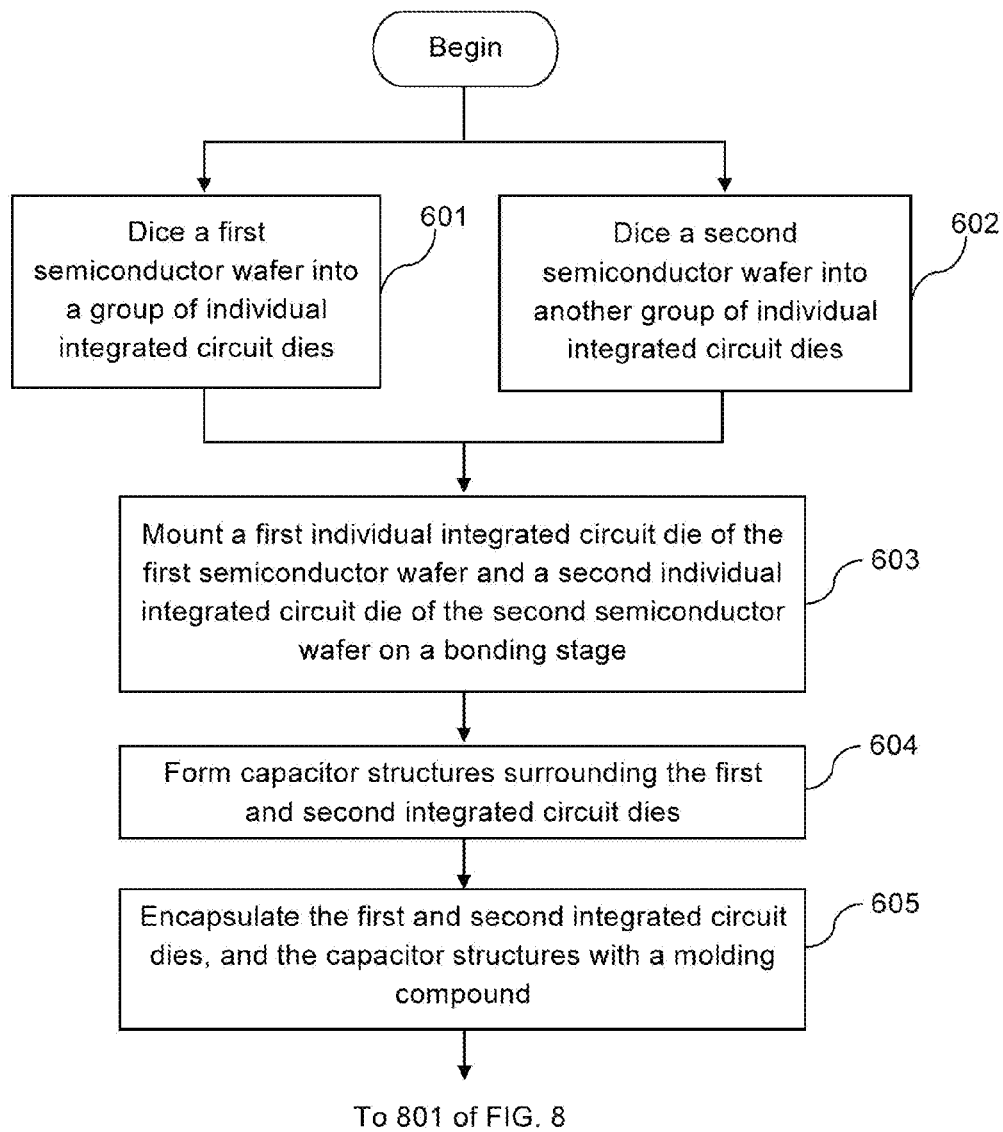
FIG. 6 is a flowchart of illustrative steps for assembling an integrated circuit package in accordance with one embodiment of the present invention.

FIG. 6 is a flowchart of illustrative steps for assembling an integrated circuit package in accordance with one embodiment of the present invention. It should be appreciated that the embodiment of FIG. 3 may be used as examples to illustrate the steps described below.

At step 601, a first semiconductor wafer (e.g., semiconductor wafer 300 of FIG. 3) is diced into a group of individual integrated circuit dies (e.g., integrated circuit dies 302 of FIG. 3). Similarly, a second semiconductor wafer (e.g., semiconductor wafer 302 of FIG. 3) is diced into another group of individual integrated circuit dies (e.g., integrated circuit dies 303 of FIG. 3). at step 602. Typically, a semiconductor wafer is "diced" into rectangular-shaped individual integrated circuits along two mutually perpendicular sets of parallel lines or streets lying between each of the rows and columns thereof. The separated or singulated integrated circuit unit is commonly referred to as a dice.

At step 603, a first individual integrated circuit die of the first semiconductor wafer and a second individual integrated circuit die of the second semiconductor are mounted on a bonding stage. As shown in FIG. 3, integrated circuit die 302 and integrated circuit die 303 are mounted on bonding stage 315. In an exemplary scenario, integrated circuit dies 302 and 303 are positioned in a suitable position (e.g., adjacent to each other) on the bonding stage (e.g., bonding stage 315 of FIG. 3). An adhesive tape, for example, may be placed on the bonding stage and used to hold integrated circuit dies 302 and 303 in place.

At step 604, capacitor structures are formed surrounding the first and second integrated circuit dies. In one embodiment, as shown in FIG. 3, capacitor structures 312 are formed surrounding integrated circuit die 302 and integrated circuit die 303. Alternatively, in another embodiment, capacitor structures 312 may be formed above integrated circuit dies 302 and 303 to accommodate smaller form factor packages.

At step 605, the first and second integrated circuit dies, and the capacitor structures are encapsulated with a molding compound. For example, as shown in FIG. 3, molding compound 310 is formed to surround integrated circuit dies 302 and 303, and capacitor structures 312. A molding process (e.g., an injection molding process) may be performed to enclose integrated circuit dies 302 and 303, and capacitor structures 312 within the melding compound 310. A more detailed description of the assembly of the individual integrated circuit dies and the molding compound will be described below with reference to steps 801-806 of FIG. 8.

Figure 7:
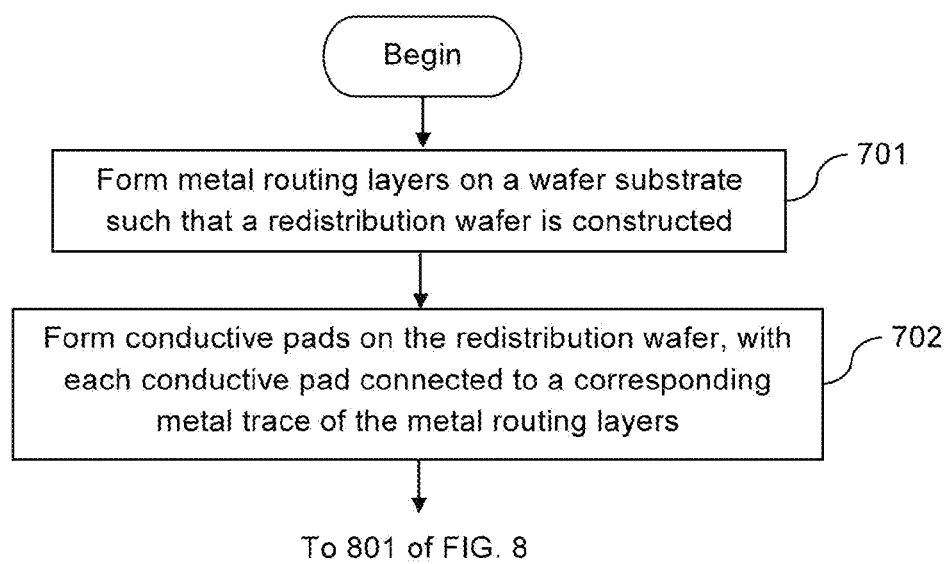
FIG. 7 is a flowchart of illustrative steps for manufacturing a redistribution water in accordance with one embodiment of the present invention.

FIG. 7 is a flowchart of illustrative steps for manufacturing a redistribution wafer in accordance with one embodiment of the present invention. It should be appreciated that the embodiment of FIG. 4 may be used as examples to illustrate the steps described below. At step 701, metal routing layers are formed on a wafer substrate such that a redistribution wafer is constructed. As shown in FIG. 4, metal routing layers 430 may form signal transmission structures in redistribution wafer 435 to electrically connect integrated circuit components that are placed on both sides of redistribution wafer 435.

At step 702, conductive pads are formed on the redistribution wafer, with each conductive pad connected to a corresponding metal trace of the metal routing layers. For example, as shown in FIG. 4, conductive pads 434A and 434B may be formed on top and bottom surfaces of redistribution wafer 435, respectively. The fabrication of conductive pads 434A and 434B may use a conventional manufacturing method, and therefore, is not described in detail in order to not unnecessarily obscure the present invention. A more detailed description of the assembly of the redistribution wafer will be described below with reference to steps 801-806 of FIG. 8.

Figure 8:
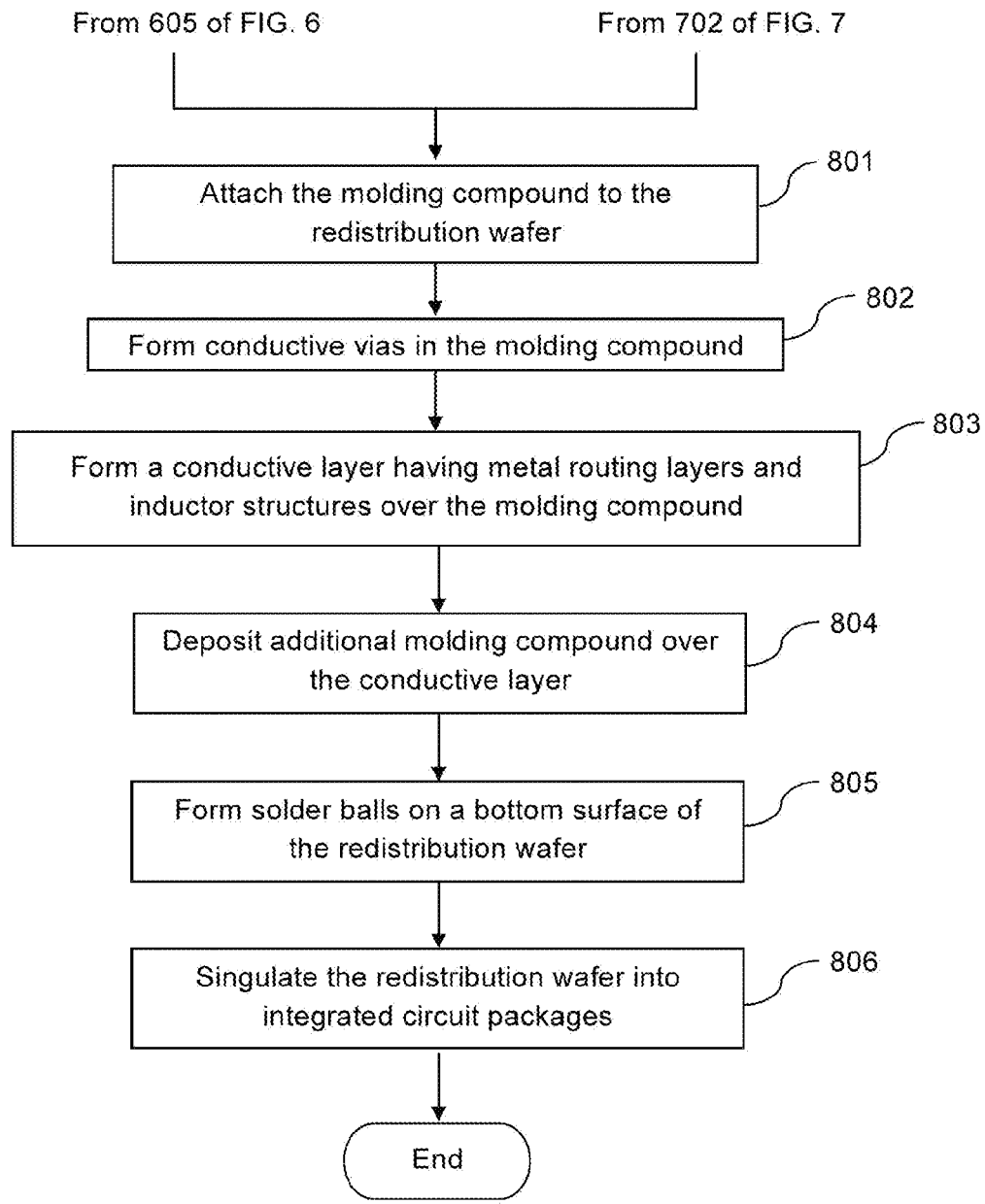
FIG. 8 is a flowchart of illustrative steps for assembling an integrated circuit package on a redistribution wafer in accordance with one embodiment of the present invention.

FIG. 8 is a flowchart of illustrative steps for assembling an integrated circuit package on a redistribution wafer in accordance with one embodiment of the present invention. It should be appreciated that the embodiment of FIGS. 1, 2, 3, 4, and 5 may be used as examples to illustrate the steps described below.

With reference to steps 601-605 shown in FIG. 6 and steps 701-702 shown in FIG. 7, the molding compound is attached to the redistribution wafer at step 801. As shown in FIG. 5, molding compound 310, which encapsulates integrated circuit dies 302 and 303 and capacitor structures 312, is attached to redistribution wafer 435. Such a configuration forms an integrated circuit package similar to integrated circuit package 100 of FIG. 1. In this step, integrated circuit dies 302 and 303 may electrically connect to redistribution wafer 435 via conductive pads 434A.

At step 802, conductive vias (e.g., conductive vias 124 of FIGS. 1 and 2, conductive vias 524 of FIG. 5) are formed in the molding compound. For example, as shown in FIG. 1, conductive vias 124 may extend between top surface and bottom surfaces of molding compound 310 to form signal transmission structures. It should be appreciated that the fabrication of the conductive vias may use a conventional manufacturing method. For instance, the conductive vias may be formed by drilling or lasering holes through the molding compound. The holes may then be plated or filled with electrically-conductive materials (e.g., copper, tungsten).

At step 803, a conductive layer (e.g., conductive layer 127 of FIG. 1, conductive layer 527 of FIG. 5) having metal routing structures and inductor structures is formed over the molding compound. For example, as shown in FIG. 5, conductive layer 527 may include metal traces 525 that are connected to inductor structures 526. Additionally, the metal traces may also connect to the conductive vias (e.g., conductive vias 524 of FIG. 5) to form conductive paths between the conductive vias and the inductor structures.

Subsequently, an additional molding compound (as highlighted in region 560 of FIG. 5) is deposited over the conductive layer at step 804. The additional molding compound (e.g., molding compound 110 of FIG. 1, molding compound 310 of FIG. 3) may be used to cover the exposed surfaces of the conductive layer so as to insulate the underlying metal traces and inductor structures from oxidation.

At step 805, solder balls (e.g., solder balls 136 of FIG. 1, solder balls 536 of FIG. 5) are formed on a bottom surface of the redistribution wafer. For example, as shown in FIG. 1, solder balls 136 may be disposed on conductive pads 134B on the bottom surface of redistribution wafer 135. Solder balls 136 may provide electrical communication from integrated circuit package 100 to a printed circuit substrate (e.g., printed circuit substrate 104), which may also host other circuits. Subsequently, the redistribution wafer is singulated (e.g., diced) into individual integrated circuit packages at step 806.

The method and apparatus described herein may be incorporated into any suitable circuit. For example, the method and apparatus may be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), and microprocessors, just to name a few.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. A method of manufacturing an integrated circuit package, comprising:
encapsulating first and second integrated circuit dies with a molding compound;
forming a passive component over the molding compound;

encapsulating the passive component in additional molding compound, wherein the additional molding compound directly contacts the molding compound; and mounting the encapsulated first and second integrated circuit dies on a redistribution wafer, wherein the first integrated circuit die is interposed between the passive component and the redistribution wafer.

2. The method defined in claim 1, further comprising:
forming a plurality of capacitor structures surrounding the first and second integrated circuit dies.

3. The method defined in claim 2, wherein mounting the encapsulated first and second integrated circuit dies comprising:
attaching the encapsulated first and second integrated circuit dies to metal routing layers, wherein the metal routing layers are part of the redistribution wafer, and wherein the metal routing layers are electrically coupled to the first and second integrated circuit dies and the plurality of capacitor structures.

4. The method defined in claim 3, further comprising:
forming a plurality of vias in the molding compound, wherein each of the plurality of vias comprises a first end contacting the metal routing layers and a second end contacting the passive component.

5. The method defined in claim 4, wherein the second integrated circuit die is smaller than the first integrated circuit die, and wherein forming the passive component over the molding compound comprises:
forming conductive loops above the first integrated circuit die.

6. The method defined in claim 3, further comprising:
forming a plurality of contact pads on top surfaces of the metal routing layers, wherein a first portion of the plurality of contact pads is electrically connected to the first integrated circuit die, and a second portion of the plurality of contact pads is electrically connected to the second integrated circuit die.

7. The method defined in claim 6, further comprising:
forming a plurality of interconnects on bottom surfaces of the metal routing layers.

8. The method defined in claim 1,
wherein the molding compound and the additional molding compound are formed from the same material.

9. An integrated circuit package produced by a process comprising the steps of:
forming a non-conductive layer that encapsulates first and second integrated circuit dies;
forming a plurality of conductive vias through the non-conductive layer; and
forming a conductive layer over the non-conductive layer, wherein the conductive layer comprises a plurality of passive structures, each of which is connected to an end of each of the plurality of conductive vias.

10. The integrated circuit package defined in claim 9, wherein the non-conductive layer comprises a molding layer.

11. The integrated circuit package defined in claim 9, wherein the process of producing the integrated circuit package further comprises:
attaching the non-conductive layer to routing layers of a redistribution wafer.

12. The integrated circuit package defined in claim 9, wherein the routing layer comprises a plurality of metal traces each of which is connected to another end of each of the plurality of conductive vias.

13. The integrated circuit package defined in claim 9, wherein the process of producing the integrated circuit package further comprises:
forming an array of solder balls on a bottom surface of the routing layer.

14. The integrated circuit package defined in claim 9, wherein the first and second integrated circuit dies are surrounded by a plurality of capacitor structures.

15. An integrated circuit package, comprising:
a first integrated circuit die;
a second integrated circuit die;
a conductive structure formed over the first integrated circuit die;
a molding compound layer that encapsulates the conductive structure, the first integrated circuit die, and the second integrated circuit die;
routing layers attached to a bottom surface of the molding compound layer; and
a plurality of vias formed in the molding compound layer, wherein each of the plurality of vias comprises a first end contacting the routing layers and a second end contacting the conductive structure.

16. The integrated circuit package defined in claim 15, wherein the conductive structure further comprises a plurality of inductor elements, each of which is positioned above the first integrated circuit die.

17. The integrated circuit package defined in claim 16, wherein each of the inductor elements comprises a conductive loop.

18. The integrated circuit package defined in claim 15, wherein the routing layers are part of a redistribution wafer.

19. The integrated circuit package defined in claim 18, the routing layers comprise redistribution layer structures that are electrically coupled to the first and second integrated circuit dies.

20. The integrated circuit package defined in claim 19, further comprising:
a plurality of capacitor structures surrounding the first and second integrated circuit dies, wherein the plurality of capacitor structures is electrically coupled to the redistribution layer structures.

* * * * *